(12) United States Patent
Laurino et al.

(10) Patent No.: US 11,552,460 B2
(45) Date of Patent: Jan. 10, 2023

(54) ELECTRICAL PANEL ADAPTER PROVIDING PASS THROUGH ACCESS TO ELECTRICAL SIGNALS WITHIN AN ENCLOSURE

(71) Applicant: Fluke Corporation, Everett, WA (US)

(72) Inventors: Ferdinand Y. Laurino, Seattle, WA (US); Carley Nicole McCutchen, Houston, TX (US); Hilton G. Hammond, Bothell, WA (US); Alois Sommer, Leobersdorf (AT); Stefan Hidegh, Brunn am Gebirge (AT); Paul Kral, Brunn am Gebirge (AT)

(73) Assignee: Fluke Corporation, Everett, WA (US)

( * ) Notice: Subject to any disclaimer, the term of this patent is extended or adjusted under 35 U.S.C. 154(b) by 791 days.

(21) Appl. No.: 16/443,572

(22) Filed: Jun. 17, 2019

(65) Prior Publication Data
US 2019/0386469 A1  Dec. 19, 2019

Related U.S. Application Data

(60) Provisional application No. 62/685,836, filed on Jun. 15, 2018.

(51) Int. Cl.
*G01R 1/20* (2006.01)
*H02B 1/38* (2006.01)
(Continued)

(52) U.S. Cl.
CPC ............... *H02B 1/38* (2013.01); *G01R 1/20* (2013.01); *G01R 11/04* (2013.01);
(Continued)

(58) Field of Classification Search
CPC .... G01R 1/0408; G01R 1/0416; H02B 1/066; H02B 1/24; H02B 1/306; H02B 1/042
See application file for complete search history.

(56) References Cited

U.S. PATENT DOCUMENTS

| 6,784,385 B2 * | 8/2004 | Hernandez-Perez ..... H02J 9/04 200/50.33 |
| 7,959,453 B2 * | 6/2011 | Guering ................... H02B 1/38 439/31 |

(Continued)

FOREIGN PATENT DOCUMENTS

| EP | 3454433 A1 * | 3/2019 | ............. G01R 11/04 |
| GB | 2465831 A | 6/2010 | |

OTHER PUBLICATIONS

European Search Report for Application No. 19180091.1, dated Oct. 11, 2019, 7 pages.
(Continued)

*Primary Examiner* — Dominic E Hawkins
(74) *Attorney, Agent, or Firm* — Seed Intellectual Property Law Group LLP

(57) ABSTRACT

An electrical panel adapter for an enclosure that is formed of at least one panel includes a main unit having a front portion and a rear portion. The rear portion is positioned inside the enclosure and includes a first plurality of electrical connections adapted to connect to electrical wires and/or equipment located inside the enclosure. The front portion extends through an aperture in the at least one panel and includes a second plurality of electrical connections adapted to connect to one or more electrical devices located outside the enclosure for measurement of both voltage and current inside the enclosure. The second plurality of electrical connections are electrically coupled to the first plurality of electrical connections. The electrical panel adapter enables electrical devices outside the enclosure to be electrically coupled to the electrical wires and/or equipment inside the enclosure without requiring the enclosure to be opened.

20 Claims, 14 Drawing Sheets

(51) Int. Cl.
  *G01R 11/04* (2006.01)
  *G01R 19/00* (2006.01)
  *G01R 21/06* (2006.01)
  *H01R 31/06* (2006.01)
  *H02G 3/02* (2006.01)

(52) U.S. Cl.
  CPC ......... *G01R 19/0092* (2013.01); *G01R 21/06* (2013.01); *H01R 31/065* (2013.01); *H02G 3/02* (2013.01)

(56) References Cited

U.S. PATENT DOCUMENTS

| | | | |
|---|---|---|---|
| 9,234,914 B2 | 1/2016 | Innes et al. | |
| 2010/0048047 A1* | 2/2010 | Parrish | H02G 3/086 439/142 |
| 2013/0279049 A1* | 10/2013 | Van Fossen | B60L 53/31 361/42 |
| 2015/0015234 A1* | 1/2015 | Ayanegui | G01R 19/155 324/76.11 |
| 2017/0070018 A1* | 3/2017 | Bautista | H01R 33/94 |
| 2017/0292975 A1* | 10/2017 | France | G01R 31/31905 |
| 2020/0191606 A1* | 6/2020 | Banhegyesi | G01D 4/004 |

OTHER PUBLICATIONS

Grace Engineered Products Inc., "3-Phase Voltage Portal Combo Unit," *Safe Side: Permanent electrical Safety Devices*, Catalog No. R-T3, 2012. (2 pages).

Grace Engineered Products Inc., "3-Phase Voltage Portal Installation Sheet," *Safe Side: Permanent electrical Safety Devices*, Catalog No. R-T3, 2012. (2 pages).

ABB, "Essailec® range Test blocks," Main catalog, ABB France Low voltage Products Division Export Department, Chassieu Cedex, France, 2011. (24 pages).

FLUKE®, "Compliance without compromise Safety without sacrifice YOUR RESULTS MATTER™," ClirVu® Series IR Windows, 2006-2017. (8 pages).

Grace Engineered Products Inc., "Optical Cable Voltage Indicator Zero Voltage on Enclosure Exterior Product Data Sheet," *Safe Side: Permanent electrical Safety Devices*, R-3F-L "XX", 2013.

Grace Engineered Products Inc., "Permanent Electrical Safety Devices (PESDs)," *Safe Side: Permanent electrical Safety Devices*, PESDs and NFPA 70E, 2013. (4 pages).

Grace Engineered Products Inc., "Single Phase Non-Contact Voltage Portal Product Data Sheet," *Safe Side: Permanent electrical Safety Devices*, Catalog No. R-1A003-LPH, R-1A003-LPF, R-1A3W-LPB, R-1A3W-LPBF, R-1A-LPA, 2006. (2 pages).

Grace Engineered Products Inc., "Thru-Door Voltage Indicator Flashing and non-Flashing Product Data Sheet," *Safe Side: Permanent electrical Safety Devices*, Catalog No. R-3W/R-3W-SR, 2013. (2 pages).

Grace Engineered Products Inc., "Thru-Door Voltage Indicator Multi-Environment CAT III/IV—Hazardous Area Product Data Sheet," *Safe Side: Permanent electrical Safety Devices*, Catalog No. R-3W2 Class 1 Division 2, 2013. (2 pages).

Grace Engineered Products Inc., "Voltage Indicator How Does it Work? Application Note," *Safe Side: Permanent electrical Safety Devices*, 2011. (4 pages).

Grace Engineered Products Inc., "Voltage Portals Improve Non-Contact Voltage Detectors Application Note," *Safe Side: Permanent electrical Safety Devices*, 2013. (4 pages).

\* cited by examiner

ELECTRICAL PANEL ADAPTER PROVIDING PASS THROUGH ACCESS TO ELECTRICAL SIGNALS WITHIN AN ENCLOSURE

BACKGROUND

Technical Field

This disclosure pertains to enclosures containing electrical wiring and equipment behind electrical panel doors, and more particularly to providing access to electrical signals from such electrical wiring and equipment for measurement of electrical parameters.

Description of the Related Art

Current workflow for electricians to access and measure electrical wiring and equipment behind electrical panels, such as power quality testing, can be time inefficient and unsafe. Time efficiency is lost when electricians schedule downtime of the electrical equipment to obtain safe access to the wiring and equipment in the enclosure. Current workflow also exposes electricians to a dangerous environment when they open the panel door to gain access to live electrical lines and equipment.

A typical workflow for electricians to perform measurements such as measuring power or logging power quality with a portable device requires time-consuming preparatory work to install current sensors and attach voltage test leads in the electrical enclosure. To avoid being exposed to a hazardous environment, electricians may be required to wear extensive personal protective equipment. Unreliable or even incorrect connections often result from working in such strained conditions. Scheduling downtime with the facility is a safer option but only feasible on rare occasions. What is needed is easier and safer access to live electrical wires and equipment located behind an electrical panel.

BRIEF SUMMARY

Disclosed herein is an electrical panel adapter for installation on at least one panel of an enclosure, which may be for example a panel door of the enclosure. The electrical panel adapter is configured to feed through electrical signals for measurement of electrical parameters of wires and equipment within the enclosure and eliminate the need for electricians to wear personal protective equipment when making connections to live electrical wires and measurement devices located behind the panel door. The panel adapter provides access from outside the enclosure to a plurality of electrical wires and/or equipment behind the panel and within the enclosure for measurement of electrical parameters, including for example (but without limitation) voltage and current measurements inside the enclosure without requiring the enclosure to be opened. In at least one embodiment, access is provided for up to four voltage channels and five current channels (e.g., three phases, neutral and ground).

In various embodiments, the panel adapter is fixed adjacent to or within an aperture defined in the panel of the enclosure. The panel adapter has terminals on its rear side that are suitable to connect to electrical wires, including rigid or stranded wires, and/or measurement equipment for receiving electrical signals (e.g., current and voltage signals) from within the enclosure. The front side of the panel adapter includes outputs in the form of sockets, such as standard 4 mm safety sockets, that allow an electrician outside the enclosure to connect measuring equipment, such as a power quality logger or a digital multimeter (DMM), to the outputs of the panel adapter and make and/or receive measurements of electrical wires and equipment inside the enclosure. In addition, the panel adapter supports instruments, e.g., 173x and 174x electrical energy/power loggers provided by Fluke Corporation, that can be powered by the measurement lines coupled to the terminals on the panel adapter. In various embodiments, customer-accessible fuses in the panel adapter prevent overcurrent in the measurement connections.

Outputs of the panel adapter provide feed-through of electrical signals from measuring equipment, such as Fluke i17XX flexible current clamps, installed on electrical wires inside the panel. For example, circular 4-pin connectors may be included to support built-in EEPROM typically found in such current measuring equipment. Sensors in the measuring equipment may be automatically detected, e.g., by Fluke 173x and 174x loggers. Adapter cables may also be used to connect electrical wires and equipment to Fluke 43X accessories and accessories without EEPROM, e.g. off-the-shelf split core transformers.

Thus, as will be appreciated from the description herein, at least one embodiment of the disclosure provides an electrical panel adapter for an enclosure that is formed of at least one panel. The electrical panel adapter includes a main unit having a front portion and a rear portion. The rear portion of the main unit includes a first plurality of electrical connections adapted to connect to electrical wires and/or equipment located inside the enclosure, while the front portion of the main unit includes a second plurality of electrical connections adapted to connect to one or more electrical devices located outside the enclosure, The second plurality of electrical connections are electrically coupled to the first plurality of electrical connections.

The electrical panel adapter is installable on the enclosure such that the rear portion of the main unit is positioned inside the enclosure and the front portion of the main unit extends through an aperture in the at least one panel so that the second plurality of connections are accessible from outside the enclosure for connection to electrical devices located outside the enclosure. When installed, the electrical panel adapter enables electrical devices outside the enclosure to be electrically coupled to the electrical wires and/or equipment inside the enclosure via the first and second electrical connections without requiring the enclosure to be opened.

Installation of the panel adapter is straightforward. For at least one embodiment of the panel adapter, installation merely requires drilling a 95 mm (4 inch) hole in the panel door and mounting the panel adapter adjacent to or within the hole in the panel door. For reliable protective earth connection, the panel adapter may utilize an AutoGround™ feature provided by Fluke Corporation. Electrical wires and measurement devices inside the enclosure are then coupled to the panel adapter to provide ongoing access to the electrical wires and measurement devices while the panel door remains closed.

A method of installing an electrical panel adapter on an enclosure formed of at least one panel may thus include defining an aperture in the at least one panel of the enclosure and fitting a main unit of the electrical panel adapter into the defined aperture, wherein the main unit has a front portion and a rear portion, the rear portion including a first plurality of electrical connections adapted to connect to electrical wires and/or equipment located inside the enclosure, and the front portion including a second plurality of electrical connections adapted to connect to one or more electrical devices located outside the enclosure, and the second plurality of electrical connections being electrically coupled to the first plurality of electrical connections. When installed, the rear portion of the main unit is positioned inside the enclosure and the front portion of the main unit extends through the aperture so that the second plurality of connections are accessible from outside the enclosure for connection to electrical devices outside the enclosure. The electrical panel adapter thus enables electrical devices outside the enclosure to be electrically coupled to the electrical wires and/or equipment inside the enclosure via the first and second electrical connections without requiring the enclosure to be opened.

Various embodiments of the panel adapter disclosed herein may thus include, by way of non-limiting example, some or all of the following concepts and features:

(1) an electrical cabinet feed-through interface that connects measurement instruments to electrical test points, such as three-phase voltage and current test points, within the cabinet;

(2) electrical access to electrical test points, such as three-phase test points, without having to open electrical cabinets, which avoids exposing personnel to hazardous electrical environment;

(3) convenient routine electrical measurements can be performed without needing to shut down operating equipment and perform a lock-out tag-out process;

(4) convenient electrical connections, such as voltage and current connections, to a measurement instrument using standard sockets;

(5) permanent wire internal voltage connections using standard screw terminals and ODU or BNC industry-standard connections for current sensor probes;

(6) during installation, orientation of the panel adapter can be rotated 360 degrees to allow for mounting of the panel adapter in any orientation;

(7) simplified installation is possible using a Kwik Stepper drill bit and electrohydraulic hole punch (100 mm, 4 Inch Diameter) to define the aperture in the panel door; and (8) Cat III 1000V/Cat IV 600V safety rating according to IEC 61010 may be achieved, with an IP67 rating when the panel adapter is protected by a protective cover in the closed position.

These concepts and features, as well as other concepts and features, are exemplified by various embodiments of the electrical panel adapter described herein.

DETAILED DESCRIPTION

In various embodiments of the present disclosure, an electrical panel adapter can be installed on at least one panel of an electrical enclosure to give access from outside the enclosure to electrical wires and equipment inside the electrical enclosure without having to open the enclosure, e.g., for measurement of electrical parameters such as voltages and currents inside the enclosure. The panel adapter thus provides greater time efficiency for measurement of live electrical parameters inside the enclosure while also keeping servicing electricians safe outside the enclosure.

Figure 2:
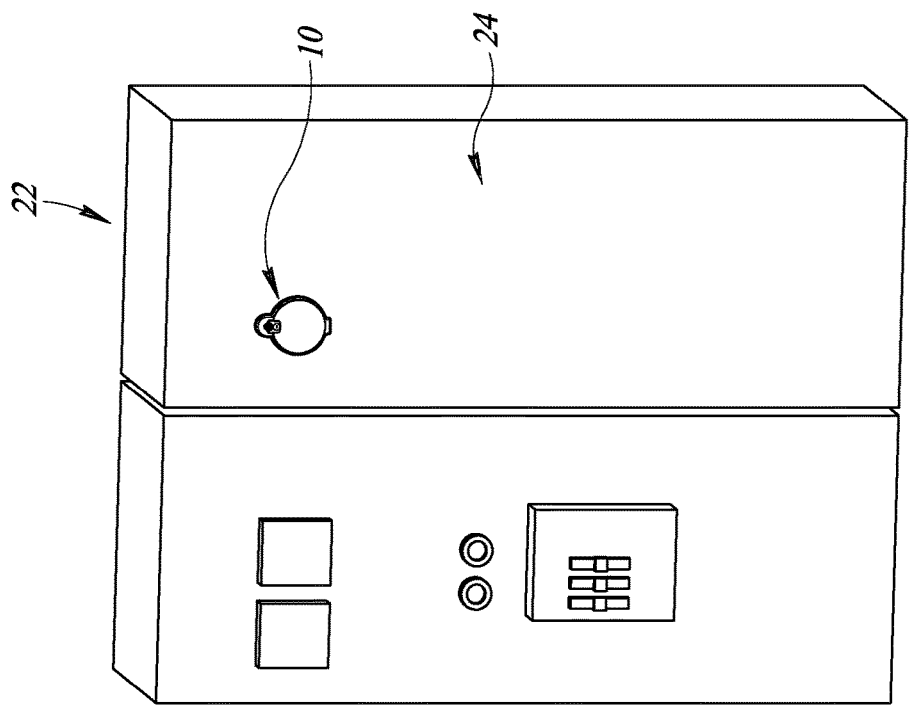
FIG. 2 is a perspective view of an enclosure with a panel adapter as shown in FIG. 1 fixed to a panel door of the enclosure, with the protective cover in a closed position.
Figure 1:
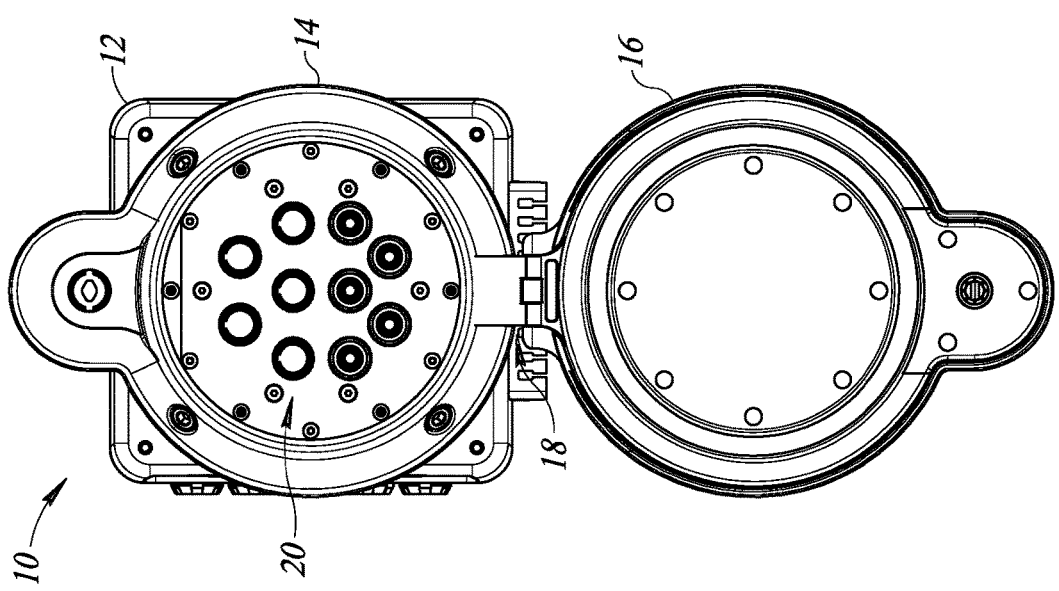
FIG. 1 is a front view of an embodiment of an electrical panel adapter according to the present disclosure, with a protective cover in an open position.

FIG. 1 illustrates an embodiment of an electrical panel adapter 10 that is fixable to a panel door of an enclosure (e.g., as shown in FIG. 2). The adapter 10 includes a main unit 12, a base frame 14, and a protective cover 16 that is coupled to the base frame 14, in this instance by a hinge 18. In FIG. 1, the protective cover 16 is shown in an open position, whereby access to electrical sockets 20 is provided for measuring electrical parameters such as voltage and current of wires and equipment inside the enclosure. One example of an enclosure is an electrical box or cabinet 22, as illustrated in FIG. 2. In FIG. 2, the adapter 10 is shown fixed to a panel door (or other panel) 24 of the electrical box or cabinet 22, with the protective cover in a closed position.

Figure 3:
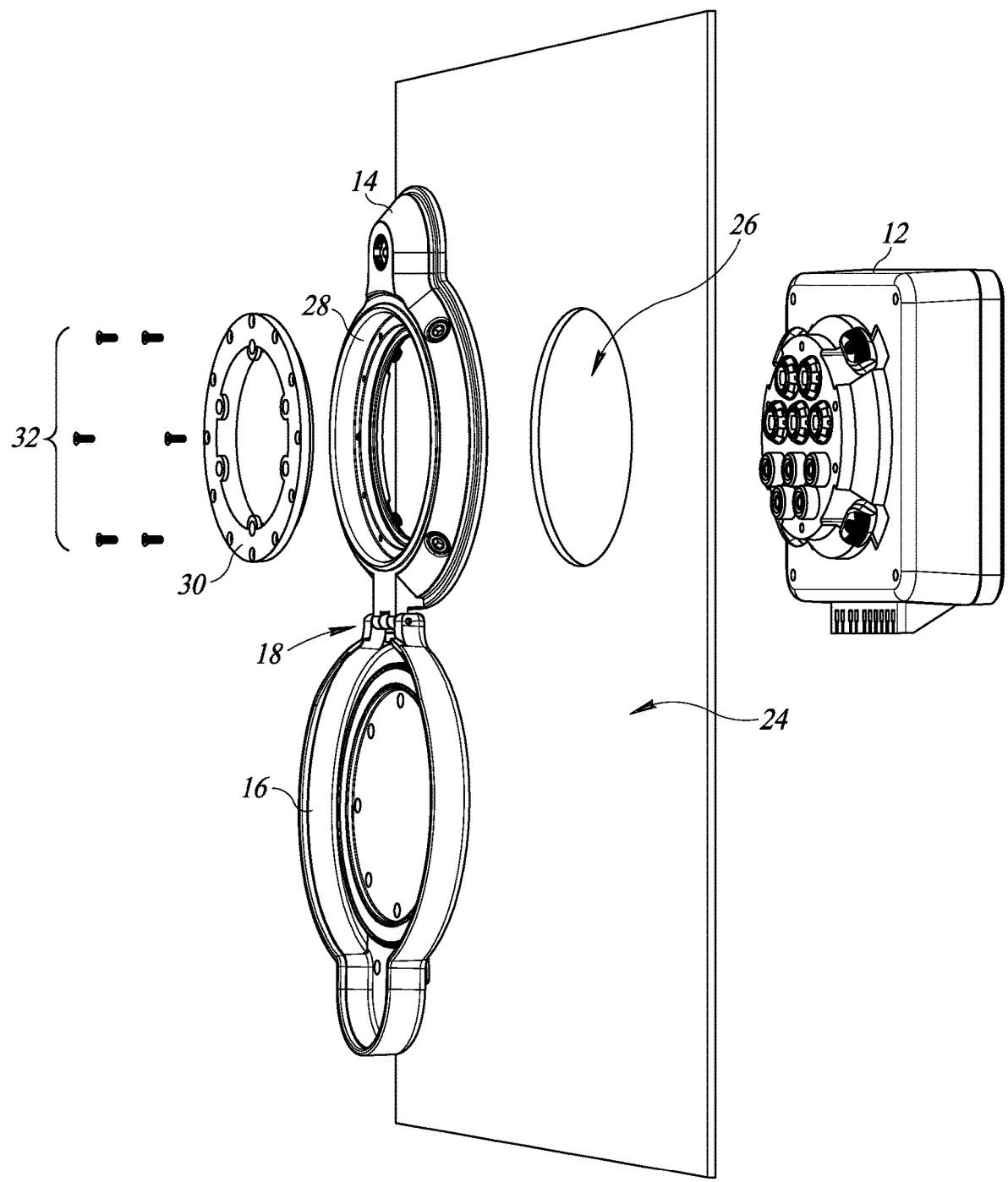
FIG. 3 is an exploded perspective side view of elements forming an embodiment of a panel adapter as shown in FIG. 1, in relation to a panel door with an aperture defined therein.

FIG. 3 is an exploded perspective side view of elements forming an embodiment of the panel adapter 10 as shown in FIGS. 1 and 2. In FIG. 3, the main unit 12 is situated behind the panel 24. A front portion of the main unit 12 is sized to fit into and/or extend through an aperture 26 defined in the panel 24. On the opposite side of the panel 24 is a base frame 14 that, when installed, abuts against the panel 24 and provides an access port 28 that is sized to provide external access to the front portion of the main unit 12 that projects into and/or through the aperture 26. In this embodiment of the panel adapter 10, a fixing ring 30 is sized and configured to fit within the frame 14 and receive screws or other fasteners 32 that pass through the fixing ring 30 into the main unit 12. The fixing ring 30 has an outer diameter that is larger than an inside diameter of at least portions of the inside sidewall of the base frame 14. Accordingly, when the fixing ring 30 is fitted within the frame 14, the screws 32 passing through the fixing ring 30 secure the frame 14 to the main unit 12 with the panel 24 sandwiched therebetween, thus fixing the frame 14 and the main unit 12 to the panel 24.

In the illustrated embodiment, the frame 14 further includes a protective cover 16 that is connected to the frame 14 by a hinge 18 and, in a closed position, provides environmental protection to electrical sockets of the main unit 12 that are otherwise accessible through the access port 28 of the frame 14 when the protective cover 16 is in an open position, as shown. In the closed position, the protective cover 16 preferably abuts against an outer circumference of the frame 14 and seals the access port 28 and front portion of the main unit 12 from the environment outside the panel adapter 10. For further environmental protection, a rear surface of the frame 14 preferably seals against the panel 24 when the frame 14 is installed and secured to the main unit 12 with the panel 24 therebetween. In at least one embodiment, the frame 14 and the main unit 12 have edge portions that abut against opposite sides of the panel 24 and form a seal around the aperture 26 in the panel 24 to protect the interior of the enclosure from the environment outside the enclosure.

In at least some embodiments, the protective cover 16 includes a transparent surface. When the protective cover is positioned in the closed position, the electrical sockets are visible through the transparent surface to the environment outside the enclosure.

Figure 4A:
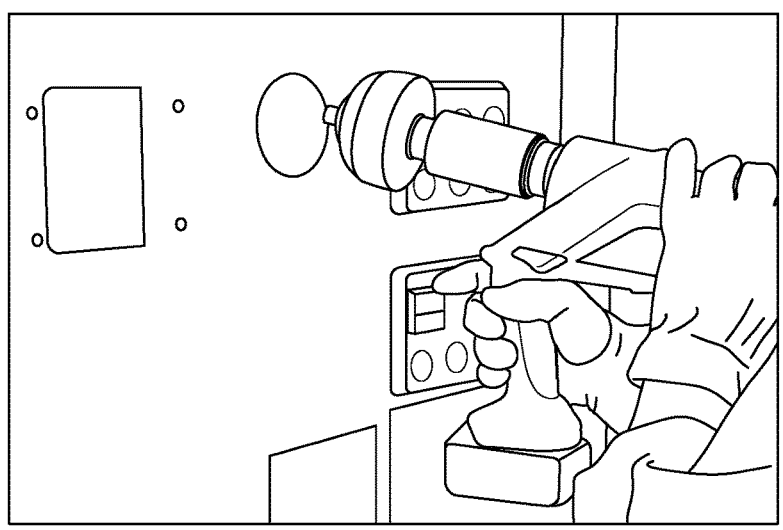
FIGS. 4A-4C illustrate one example of a process for installation of at least one embodiment of a panel adapter according to the present disclosure.
Figure 4B:
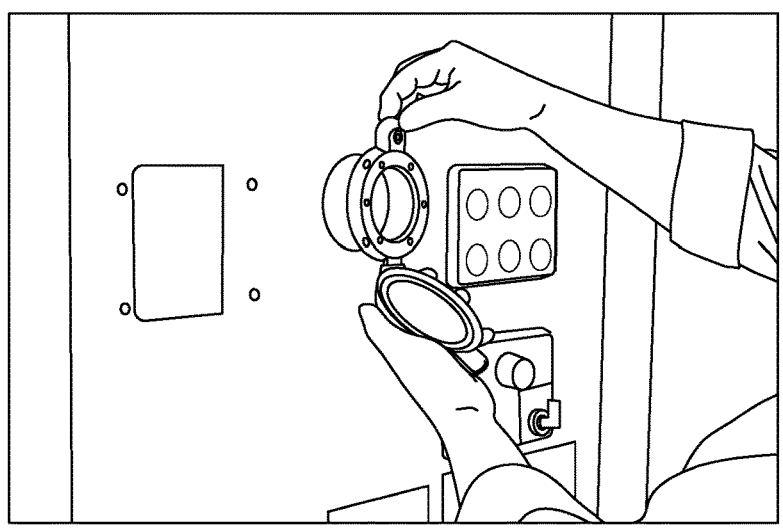
Figure 4C:
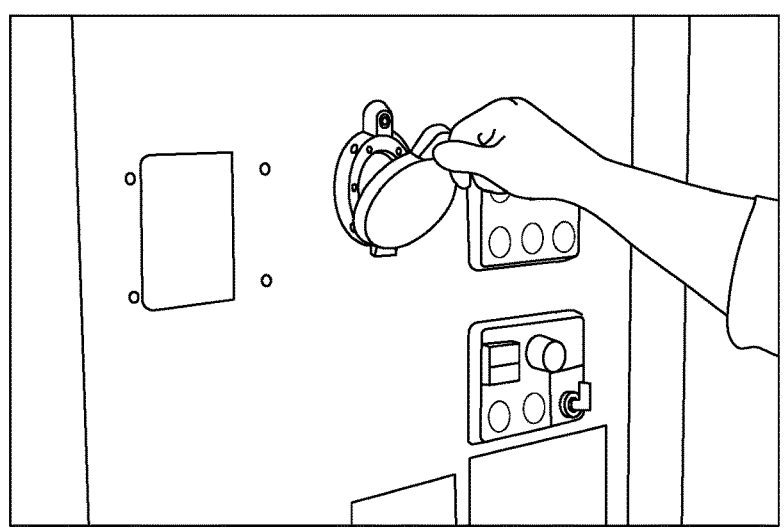

FIGS. 4A-4C illustrate one example of a process for installation of at least one embodiment of the panel adapter 10. In a first step 40, an aperture is defined in a panel door. For example, a Kwik Stepper drill bit or electrohydraulic hole punch may be used to cut or otherwise define the aperture in the panel door.

Figure 13:
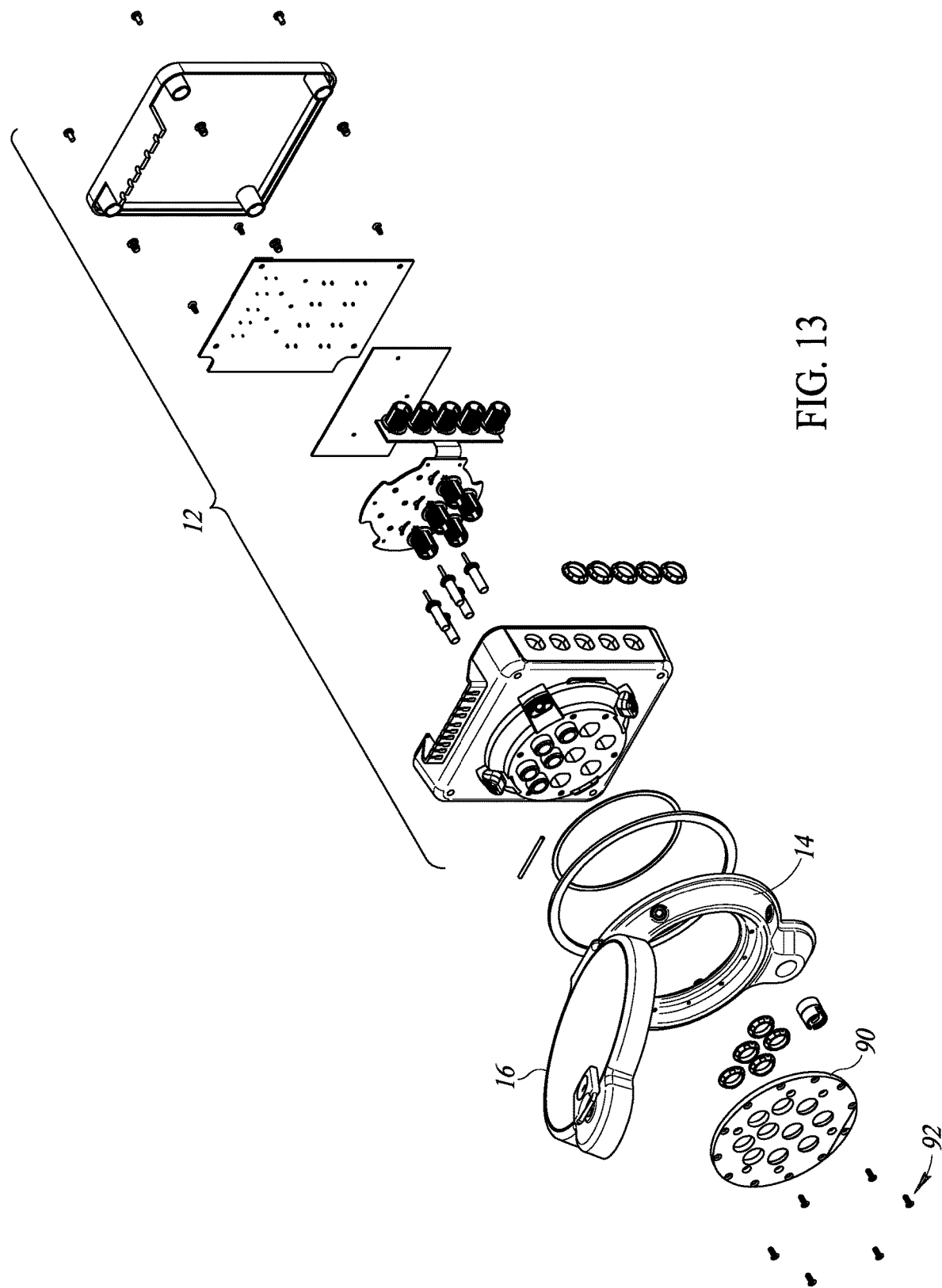
FIG. 13 is an exploded perspective view of elements forming an embodiment of a panel adapter according to the present disclosure.

In a second step 42, a base frame and hingedly-connected protective cover as shown in FIG. 3 are fitted to the outside of the panel door around the defined aperture. At the same time, a main unit as described in FIG. 3 is positioned on the opposite side of the panel door such that a portion of the main unit extends into and/or through the aperture. The base frame and the main unit are thereafter secured to each other such that the base frame and main unit are fixed to opposite sides of the panel door. For example, a fixing ring 30 as described in FIG. 3 or a fixing plate 90 as shown in FIG. 13 may be used to secure the base frame to the main unit with the panel door therebetween.

With the main unit and the base frame thus secured to each other on opposite sides of the panel door, in a third step 44 the protective cover may be rotated about the hinge connection relative to the base frame to close the protective cover upon the base frame. In the closed position, the protective cover protects electrical sockets on a front portion of the main unit from the environment external to the panel door and the panel adapter.

Figure 5A:
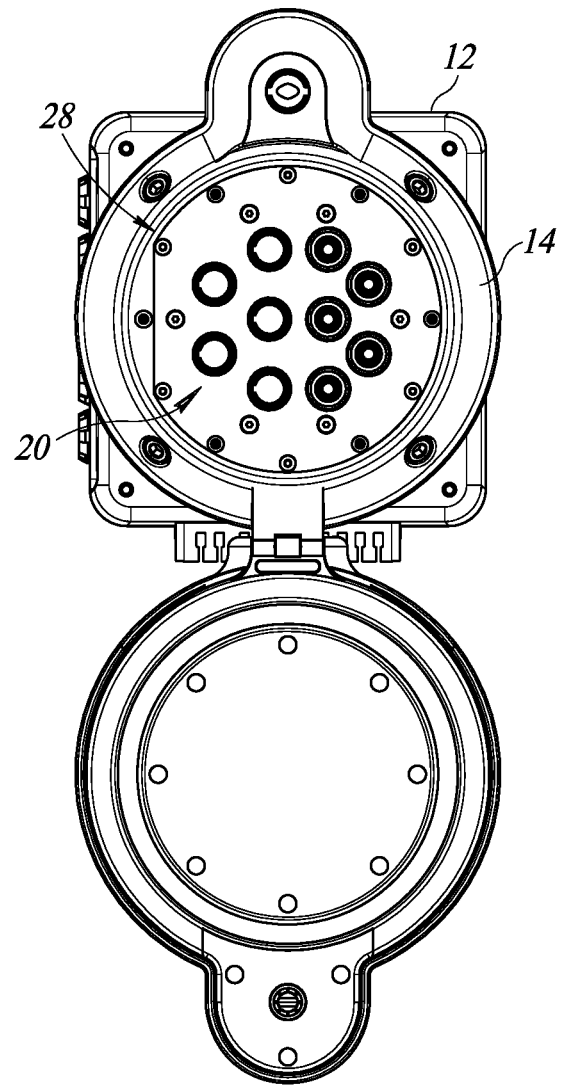
FIGS. 5A-5D illustrate a front view of a panel adapter having a main unit mounted to a base frame in different mounting orientations according to the present disclosure.
Figure 5B:
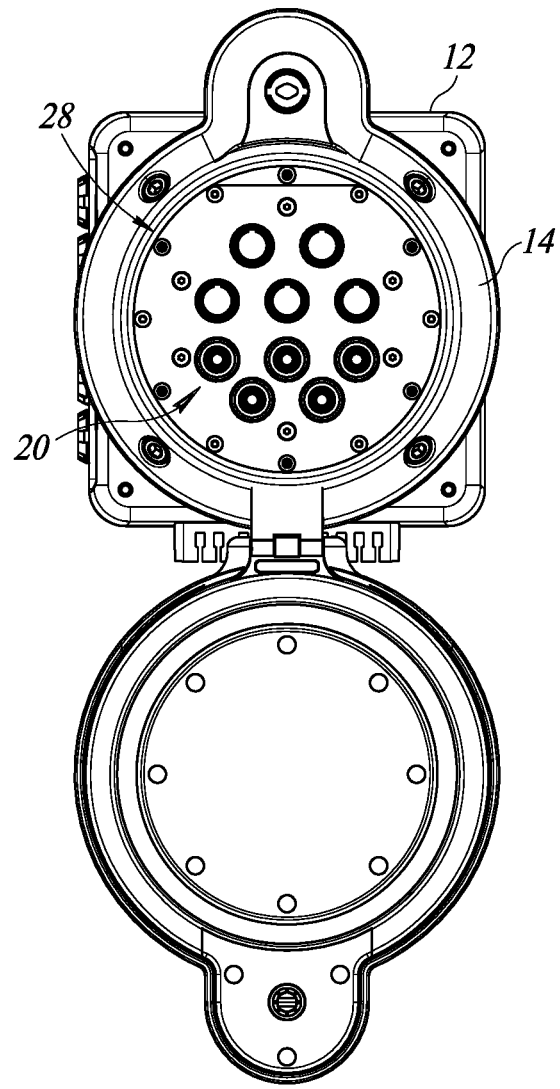
Figure 5C:
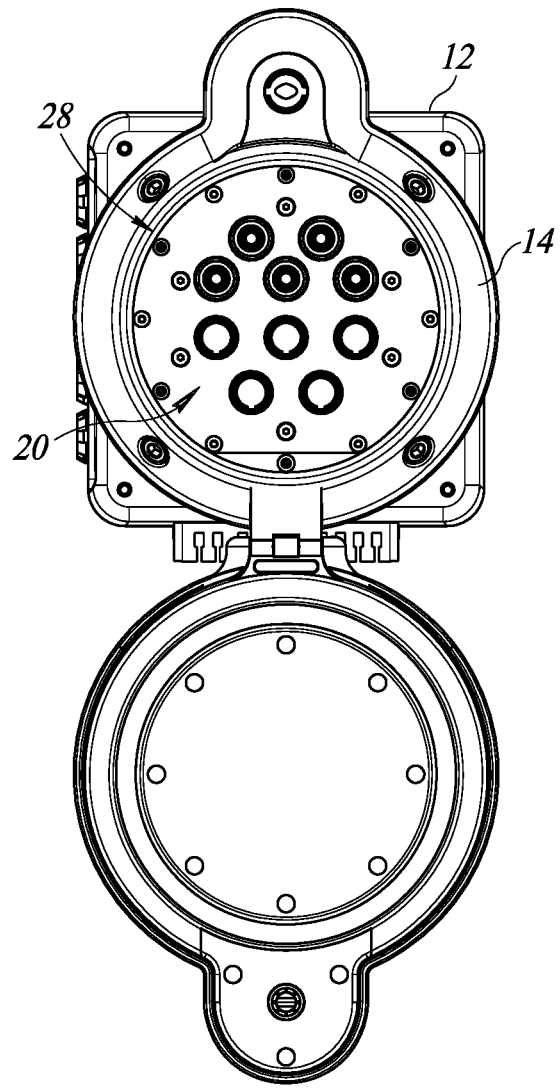
Figure 5D:
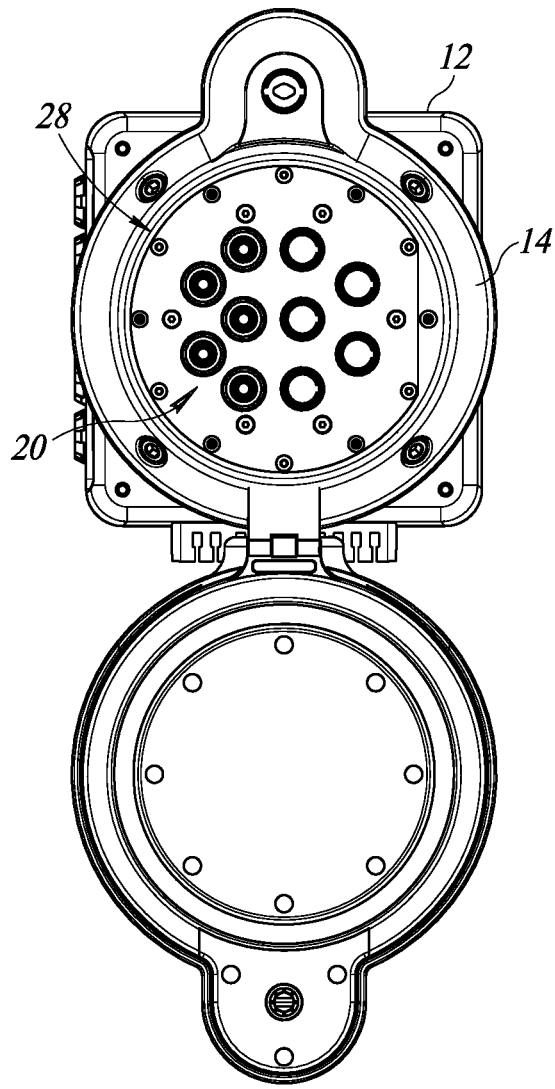

Referring now to FIGS. 5A-5D, in various embodiments, the main unit 12 may be secured to the base frame 14 in different mounting positions. In FIG. 5A for example, the main unit 12 is positioned such that the electrical sockets 20 of the main unit 12 are mounted within the access port 28 of the frame 14 to provide current measurement connections on the left half of the frame and voltage measurement connections on the right half of the frame. In FIG. 5B for example, the main unit 12 is rotated and mounted within the access port 28 of the frame 14 such that the current measurement connections are on the top half of the frame and the voltage measurement connections on the bottom half of the frame. In FIG. 5C for example, the main unit 12 is further rotated and mounted within the access port 28 of the frame 14 such that the current measurement connections are on the bottom half of the frame and the voltage measurement connections are on the top half of the frame. Lastly, in FIG. 5D for example, the main unit 12 is rotated and mounted within the access port 28 of the frame 14 such that the voltage measurement connections are on the left half of the frame and the current measurement connections are on the right half of the frame.

In this manner, allowing the main unit 12 to rotate, e.g., up to 360 degrees, with respect to the panel 24 provides greater flexibility when connecting the main unit 12 to electrical wires and equipment inside the electrical enclosure. As can be seen in FIG. 3 and further detailed in FIGS. 9A-9C, the main unit 12 includes electrical connection points for connecting e.g. voltage measuring lines and current measuring equipment inside an electrical enclosure to the main unit 12. Once the voltage measuring lines and current measuring equipment are connected to the main unit 12, the electrical sockets 20 on the front of the main unit 12 provide outside pass-through access to electrical signals from the voltage measuring lines and current measuring equipment inside the electrical enclosure. Depending on the relative position of the voltage measuring lines and current measuring equipment inside the electrical enclosure, an electrician can selectively rotate and mount the main unit 12 within the access port 28 of the frame 14 as shown in FIGS. 5A-5D to facilitate coupling of the main unit 12 to the voltage measuring lines and current measuring equipment. For example, when installing the panel adapter, an electrician can selectively mount the main unit 12 in different areas of a panel door and mount the main unit 12 within the frame 14 so that connection points of the main unit 12 are more easily coupled to the voltage measuring lines and current measuring equipment behind the panel door. The main unit 12 can likewise be rotated and mounted within the frame 14 in a different orientation if the installing electrician finds other components within the electrical enclosure blocking access to the connection points of the main unit 12.

Figure 6:
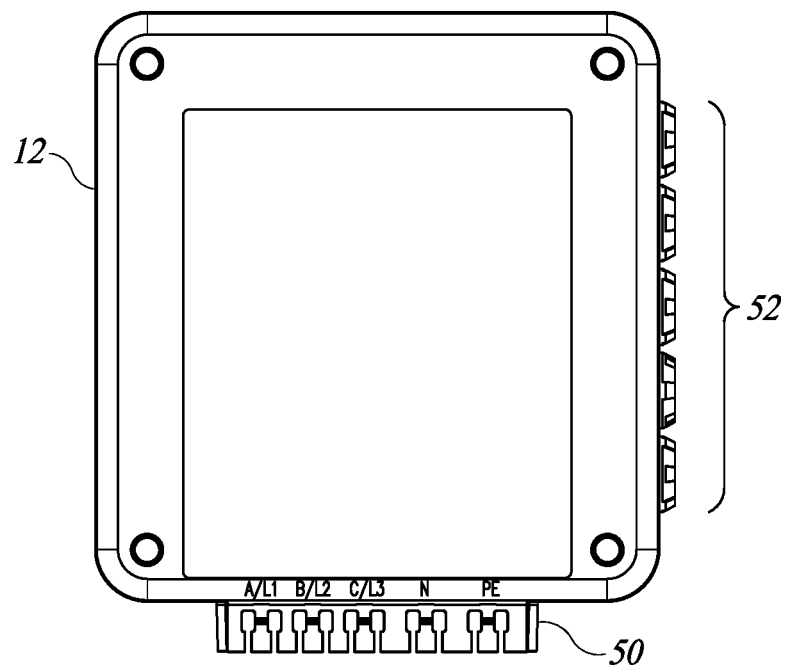
FIG. 6 is a rear view of the main unit of a panel adapter with electrical connection points for coupling electrical wires and equipment, such as voltage measuring lines and current measurement devices, to the main unit.
Figure 7:
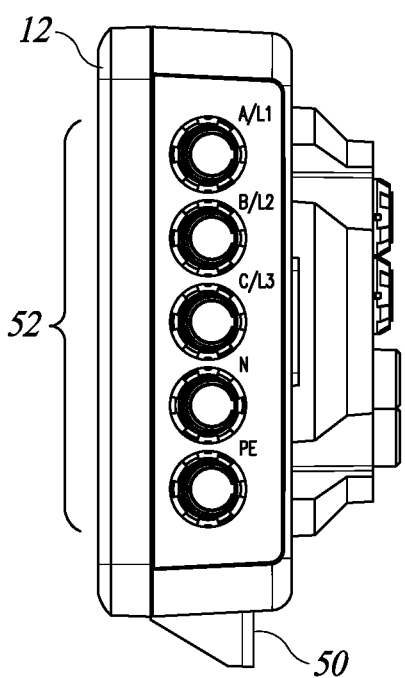
FIG. 7 is a side view of the main unit shown in FIG. 6.

FIG. 6 is a rear view of the main unit 12 with electrical connection points 50 for coupling measuring lines, such as voltage measuring lines, inside the enclosure to the main unit 12, as well as electrical connection points 52 for coupling measuring equipment, such as current measuring equipment, inside the enclosure to the main unit 12. The electrical connection points 50 and 52 are further shown in FIGS. 9A-9C and FIG. 11. As can be seen in FIG. 6, the main unit 12 preferably includes appropriate labeling for the voltage connection points 50, in this instance including three lines or phases, a neutral, and an earth or ground connection, that are labeled A/L1, B/L2, C/L3, N and PE, respectively. FIG. 7 is a side view of the main unit 12, with appropriate labeling for the current connection points 52, including in this instance five current channels, similarly for three phases, neutral, and ground, respectively labeled A/L1, B/L2, C/L3, N and PE.

Figure 8A:
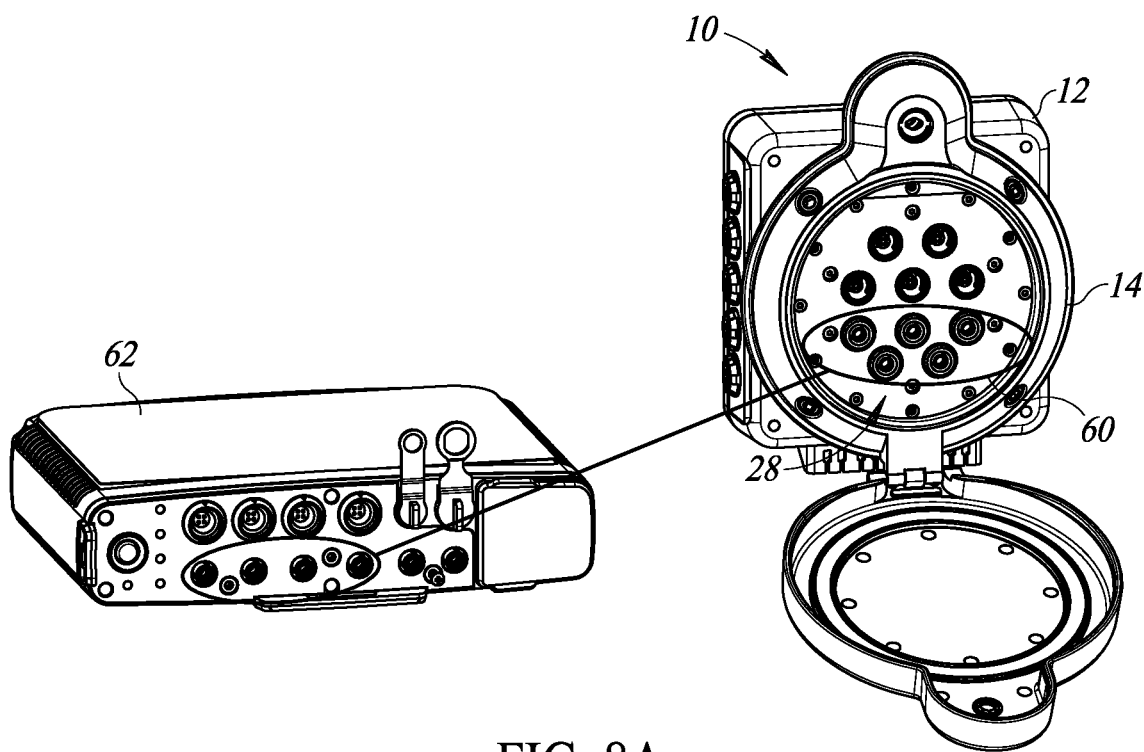
FIG. 8A-is a perspective view of a panel adapter with electrical sockets on a front portion of the main unit couplable via cabling to inputs on a rear portion of an external measurement device.
Figure 8B:
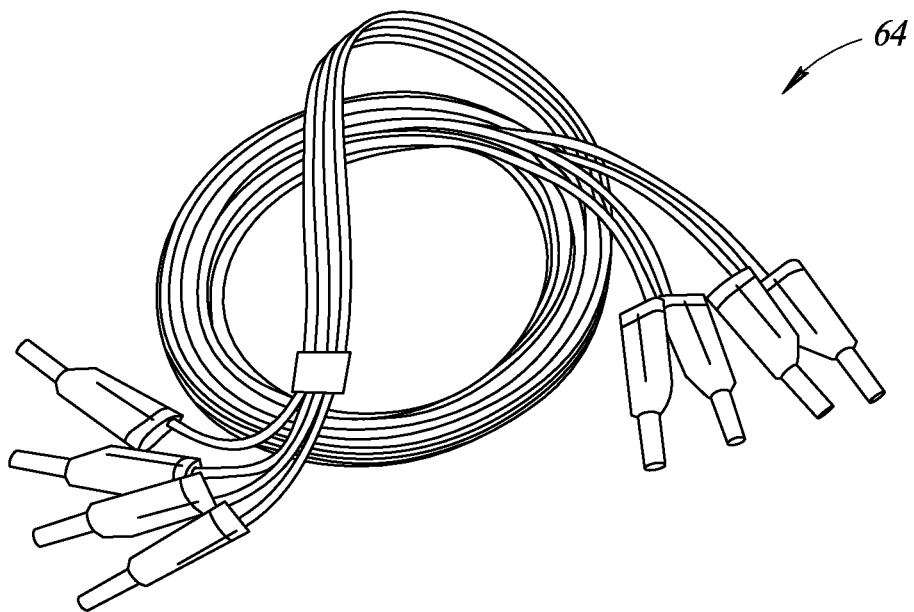
FIG. 8B is a perspective view of cabling that may be used to couple electrical sockets of the panel adapter to the external measurement device shown in FIG. 8A.

The electrical sockets 20 on the front portion of the main unit 12, as depicted in FIG. 1, are further illustrated and discussed in reference to FIGS. 8A-8D. As noted earlier, test points within an electrical enclosure for which electrical measurements, such as voltage measurements, are desired may be coupled to the connection points 50 of the main unit 12. Circuitry within the main unit 12 (discussed below with regard to FIGS. 10 and 11) electrically couples the connection points 50 with corresponding electrical sockets 60 on the front of the main unit 12. The electrical sockets 60, which are accessible through the access port 28 of the frame 14, may respectively be coupled via cabling to inputs on one or more measurement devices, such as a power quality logger 62, as shown in FIG. 8A. FIG. 8B illustrates a cable 64 with suitable connectors for electrically coupling measurement inputs, such as voltage measurement inputs, of the measurement device 62 to the electrical sockets 60. For example, in at least one embodiment, the electrical sockets 60 are comprised of five 4 mm safety sockets that are connectable to a measurement device, such as the power quality logger 62, using standard 4 mm leads as shown in FIG. 8B.

Figure 8C:
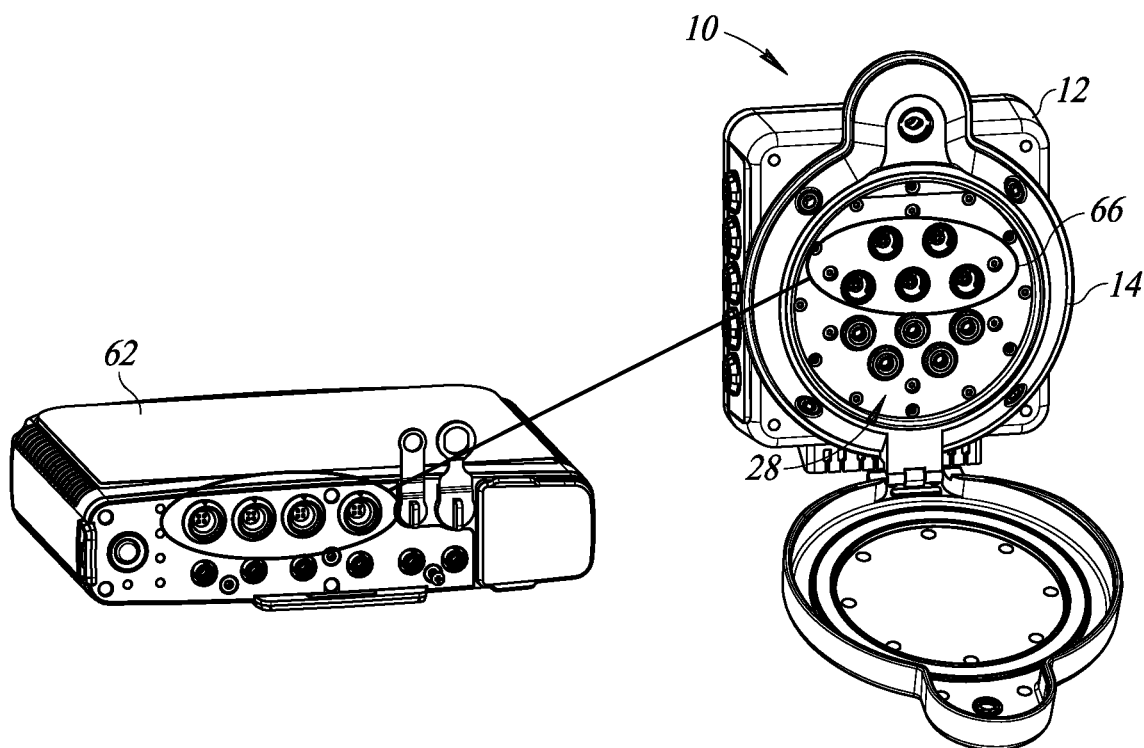
FIG. 8C is a perspective view of the panel adapter shown in FIG. 8A with electrical sockets on the front portion of the main unit couplable via cabling to other inputs on the rear portion of the external measurement device.
Figure 8D:
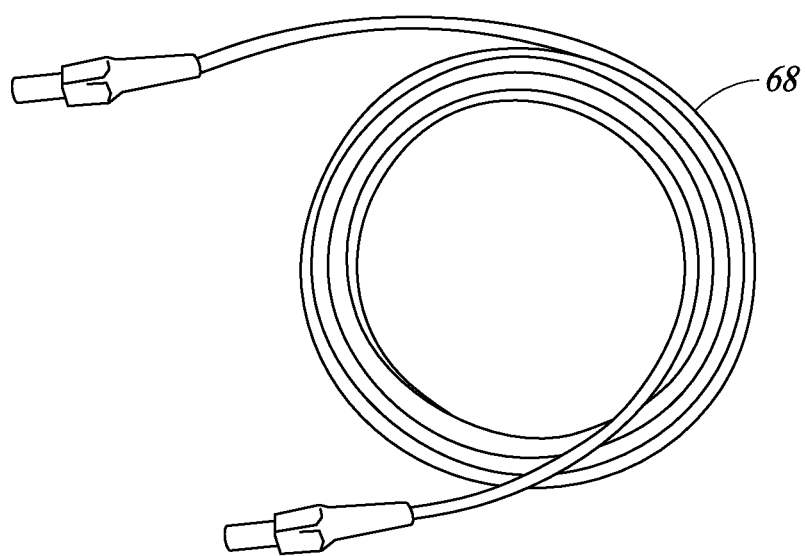
FIG. 8D is a perspective view of cabling that may be used to couple electrical sockets of the panel adapter to the external measurement device shown in FIG. 8C.

Also, as noted earlier, within the electrical enclosure, measurement devices such as current measurement devices may be arranged to measure current flowing in electrical wires or equipment for which current measurements are desired. The current measurement devices in the enclosure are coupled to the connection points 52 of the main unit 12. Circuitry within the main unit 12 electrically couples the connection points 52 with corresponding electrical sockets 66 on the front portion of the main unit 12, as illustrated in FIG. 8C. The electrical sockets 66, which are accessible through the access port 28 of the frame 14, may respectively be coupled via cabling to one or more measurement devices, such as the power quality logger 62 shown in FIG. 8C. FIG. 8D illustrates a cable 68 with suitable connectors for electrically coupling measurement inputs, such as current measurement inputs, of the measurement device 62 in FIG. 8C to the electrical sockets 66. For example, in at least one embodiment, the electrical sockets 66 are comprised of five ODU sockets that are connectable to a measurement device, such as the power quality logger 62, using a connection cable 68 as shown in FIG. 8D.

Figure 9A:
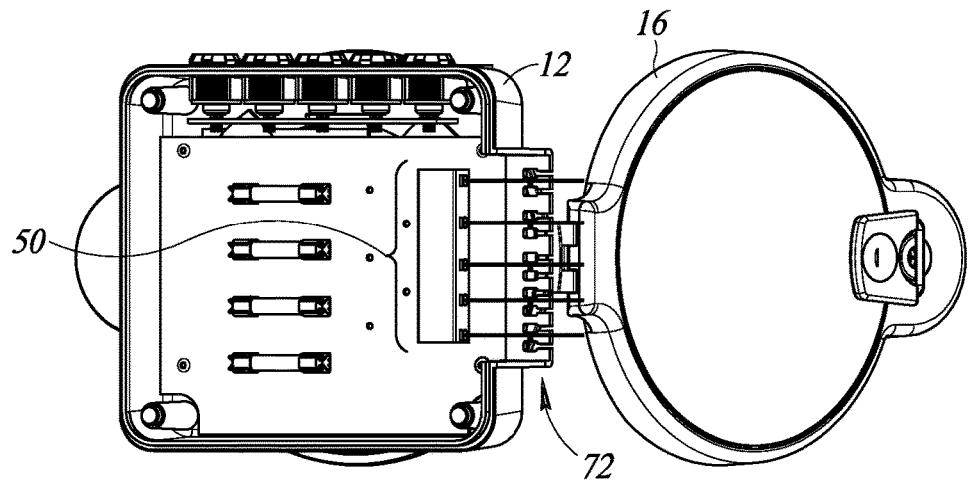
FIG. 9A is a rear perspective cross-section view of the main unit of a panel adapter with connection points for coupling voltage measuring lines to the main unit.
Figure 9B:
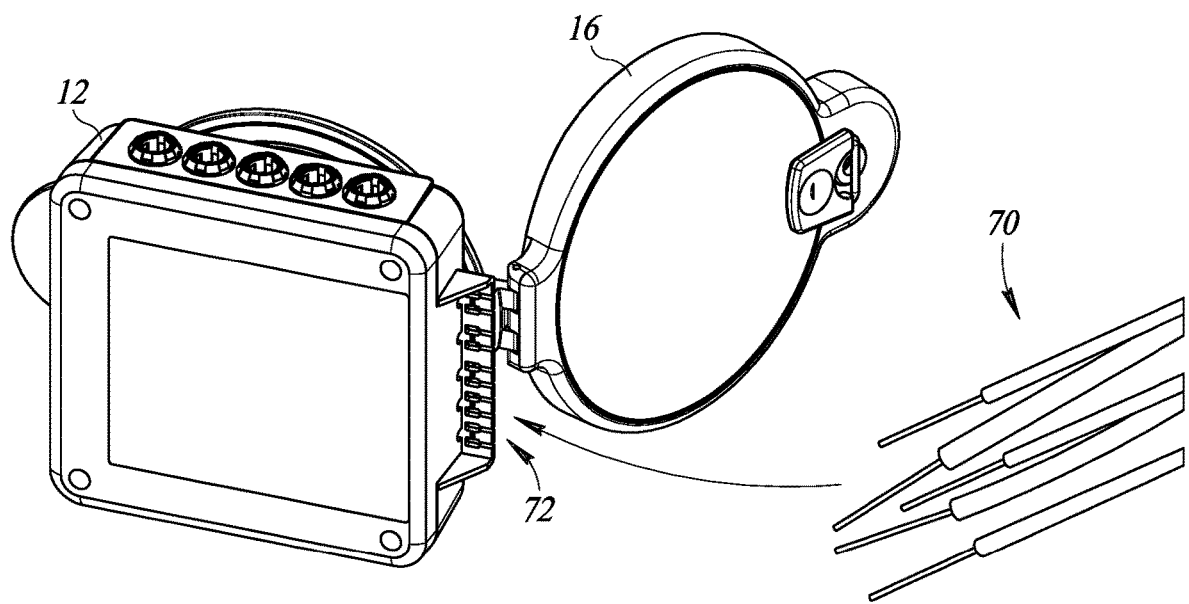
FIG. 9B is a rear perspective view of the main unit of a panel adapter as shown in FIG. 9A further illustrating a coupling of voltage measuring lines to the main unit.

FIGS. 9A and 9B further illustrate the connection points 50 for connecting measuring lines 70, which may be voltage measuring lines, to the main unit 12. For at least one embodiment of the panel adapter 10, during installation of the panel adapter 10, the measuring lines 70 are connected to the connection points 50 via screw terminals on the main unit 12. Exposed ends of the measuring lines 70 may be wrapped around or otherwise secured to the connection points 50, thus providing a wired galvanic connection of the connection points 50 to respective test points of electrical wiring or equipment within the enclosure where the main unit 12 is situated. As illustrated, the main unit 12 further includes a notched structure 72 that extends from a surface of the main unit 12 adjacent to the connection points 50. When the measuring lines 70 are installed and connected to the connection points 50, the measuring lines 70 may be fitted within notches of the notched structure 72. The notched structure thereby provides relief for the measuring lines 70 from strain that may occur on the lines from movement of the measuring lines, e.g. if the panel door to which the measuring unit 12 is mounted is opened at a later time.

Figure 9C:
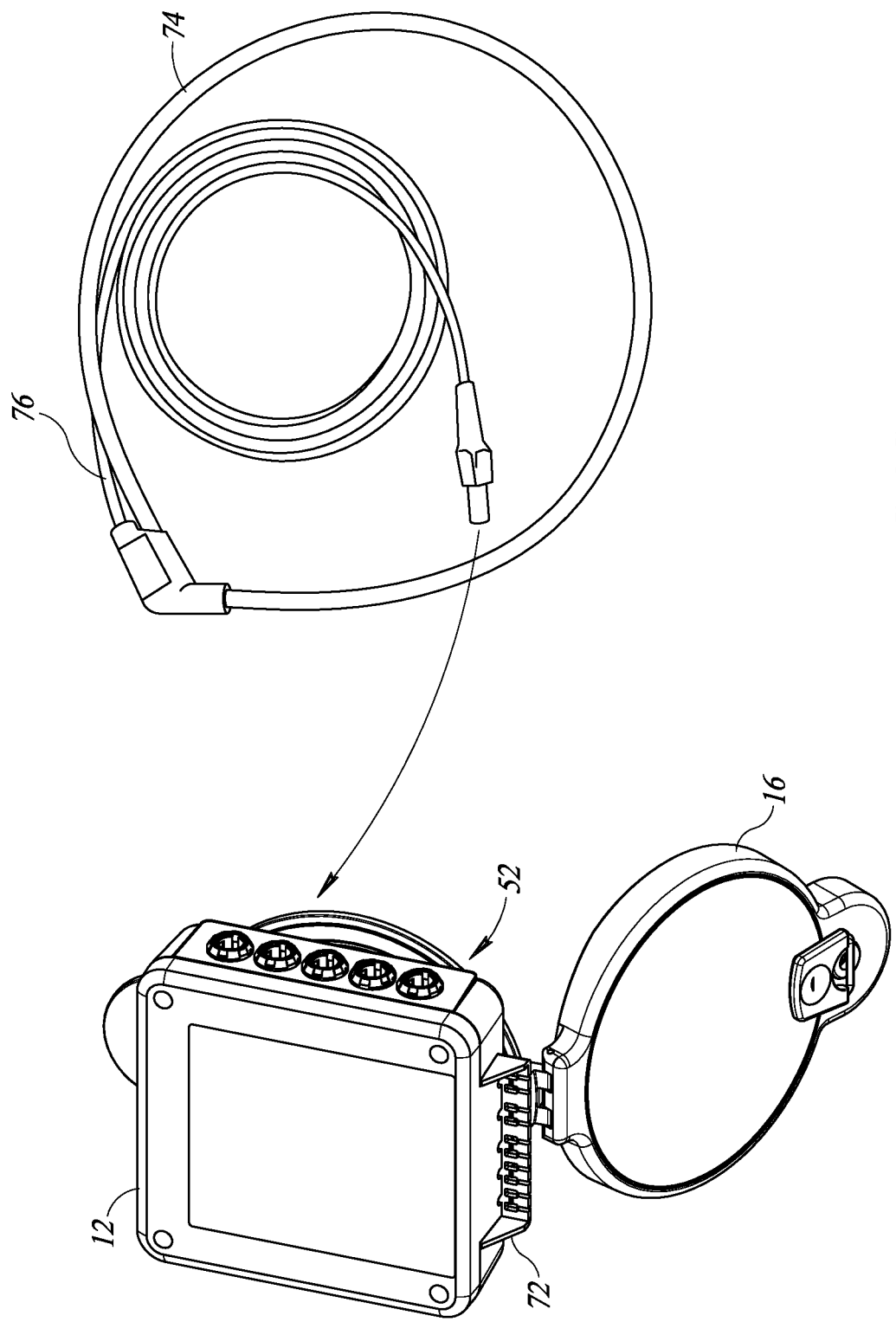
FIG. 9C is a rear perspective view of the main unit of a panel adapter as shown in FIG. 9A further illustrating connection points for coupling a current measuring device to the main unit.

FIG. 9C illustrates the connection points 52 for connecting measurement devices, such as current measuring devices, an example being a Rogowski coil 74, to the main unit 12. For at least one embodiment of the panel adapter 10, during installation of the adapter 10, current measurement devices 74 are electrically connected to the connection points 52 via cables 76 having appropriate connectors that match the sockets of the connection points 52. For example, current measurement devices 74 such as standard Fluke current sensors may be coupled by respective cables 76 using known ODU connectors. Connected in this manner, the current measurement devices 74 measure current flowing through wiring of interest inside the electrical enclosure and supply the current measurements to the main unit 12. Circuitry in the main unit 12 electrically couples the connection points 52 to the electrical sockets 66 (see FIG. 8C) which provide external access to the current measurements by a measurement device, such as the power quality logger 62.

It is noted that the panel adapter 10 may be adapted to support instruments that can be powered by one or more of the measurement lines coupled to the panel adapter. Circuitry within the main unit 12 may include one or more electrical lines connected to an output socket that draw a small amount of power from the electrical lines or equipment being measured and deliver the power to a measurement device coupled to the panel adapter 10.

Figure 10:
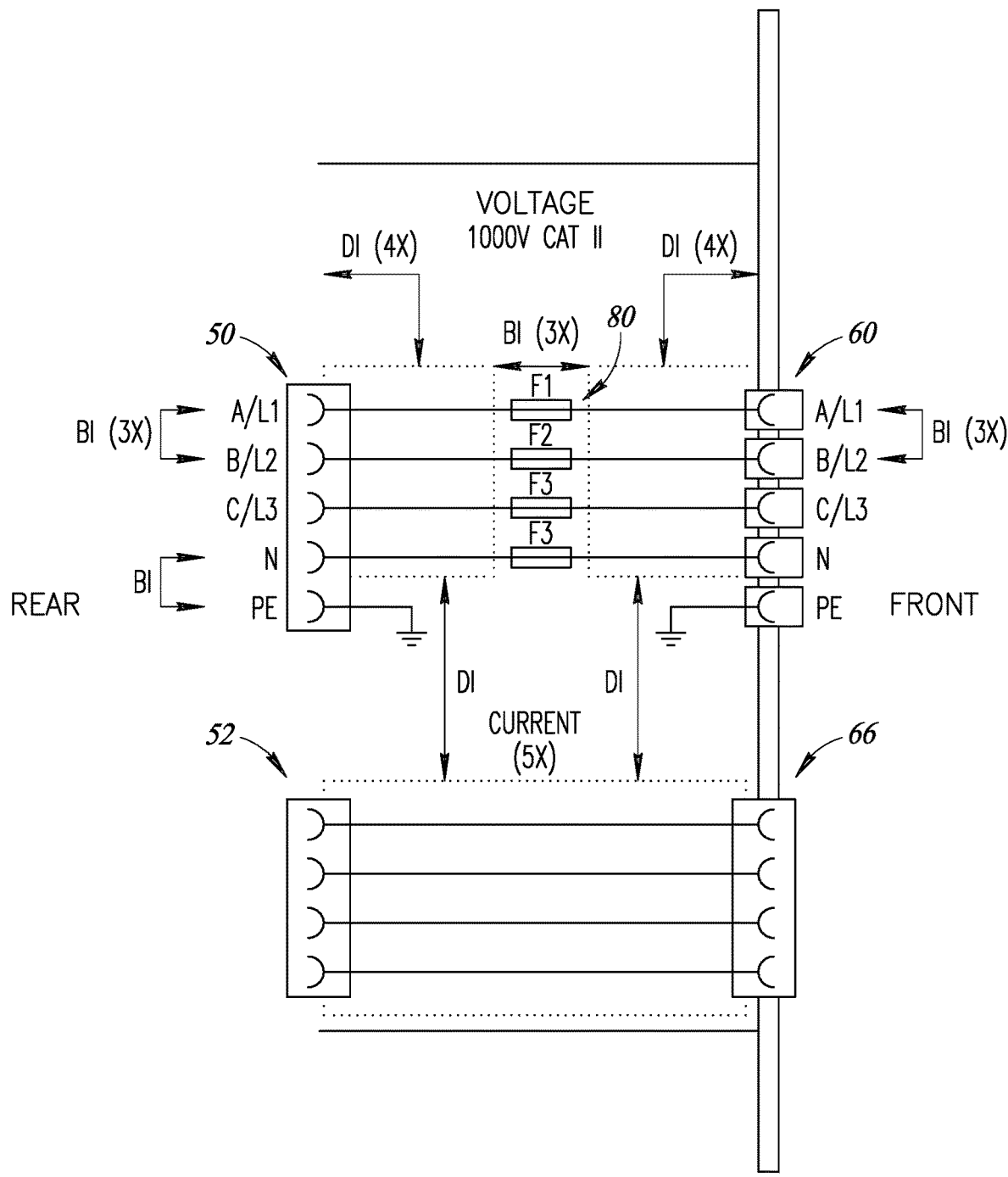
FIG. 10 is a schematic diagram illustrating circuitry inside at least one embodiment of the main unit of a panel adapter.
Figure 11:
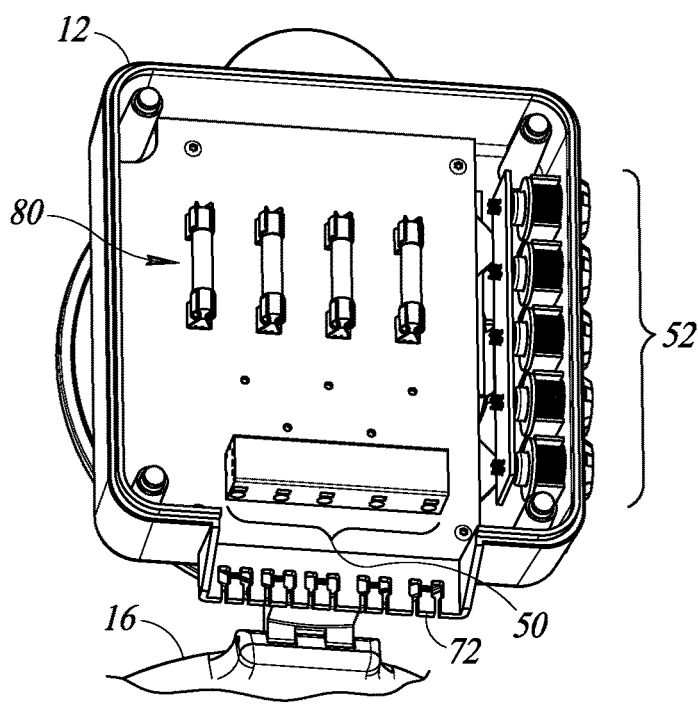
FIG. 11 is a rear perspective cross-section view of the main unit of a panel adapter as shown in FIG. 9A.

FIG. 10 provides a schematic diagram illustrating circuitry inside at least one embodiment of the main unit 12, while FIG. 11 is a rear perspective cross-section view of the main unit 12 including said circuitry. Voltage connection points 50 labeled A/L1, B/L2, C/L3, and N, are coupled to respective electrical sockets 60 via respective overcurrent protection devices 80. The overcurrent protection devices 80, which may comprise any standard type fuse or circuit breaker, provide overcurrent protection to measuring equipment, such as the power quality logger 62 shown in FIGS. 8A and 8C, that is coupled to the electrical sockets 60. Current measurement connection points 52 are directly electrically coupled to respective electrical sockets 66. Since current measurement devices, such as the Rogowski coil 74 shown in FIG. 9C, are not galvanically connected to electrical wires or equipment but instead sense current by way of electromagnetic fields using current transformer techniques, overcurrent protection between the connection points 52 and the electrical sockets 66 is not needed.

Figure 12A:
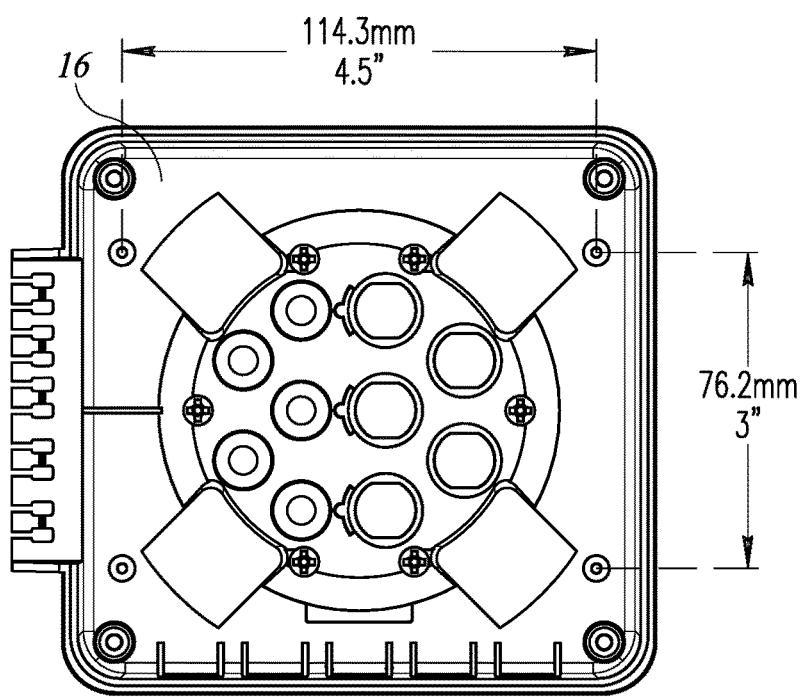
FIG. 12A is a pictorial front view of at least one embodiment of the main unit illustrating dimensional aspects of the main unit.
Figure 12B:
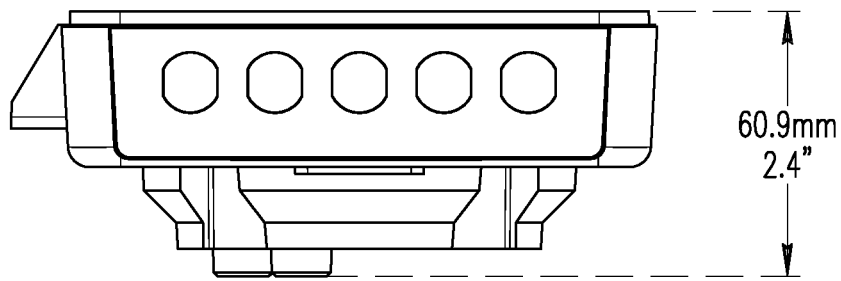
FIG. 12B is a pictorial side view of at least one embodiment of the main unit illustrating a dimensional aspect of the main unit.
Figure 12C:
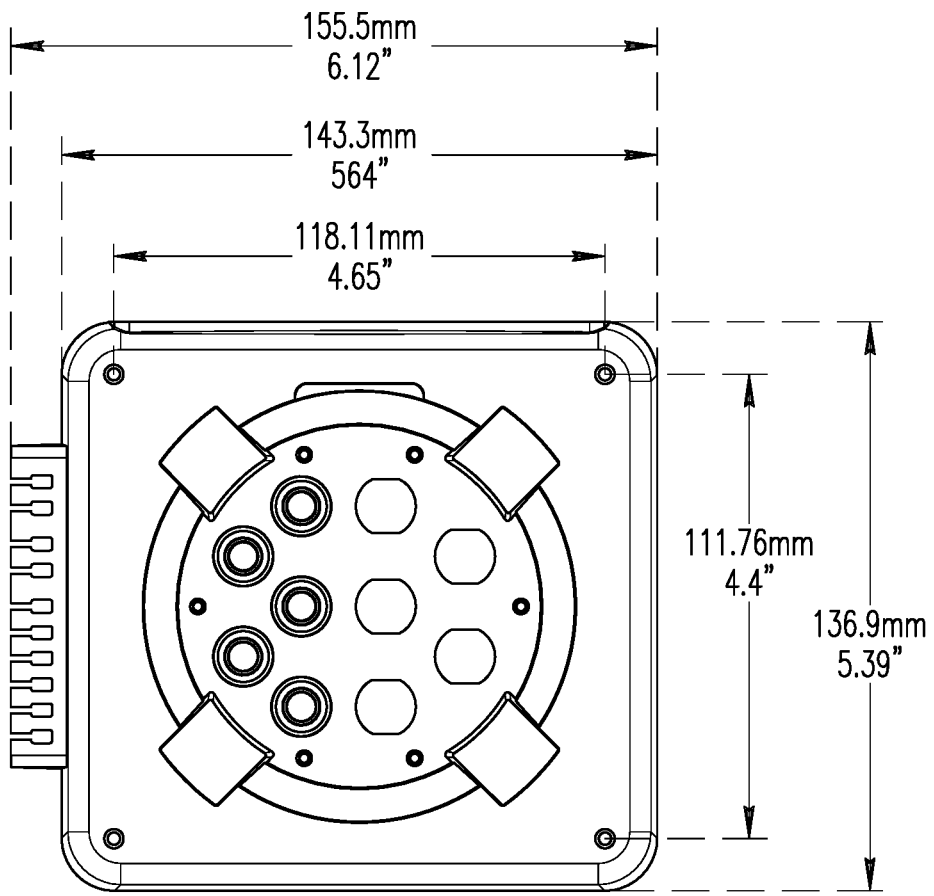
FIG. 12C is a pictorial front view of at least one embodiment of the main unit illustrating dimensional aspects of the main unit.

FIG. 12A is a pictorial front view of at least one embodiment of the main unit 12 illustrating dimensional aspects of the main unit. FIG. 12B is a pictorial side view of at least one embodiment of the main unit 12 illustrating a dimensional aspect of the main unit, while FIG. 12C is a pictorial front view of at least one embodiment of the main unit 12 illustrating additional dimensional aspects of the main unit. In these particular embodiments, the specific dimensions may be useful when constructing and installing a main unit 12 according to the present disclosure.

Lastly, FIG. 13 provides an exploded perspective view of elements forming an embodiment of the panel adapter 10. In FIG. 13, a main unit 12 is comprised of a housing with an electrical circuit board having electrical circuity coupled to electrical sockets and connections as earlier described. A base frame 14 is sized to provide external access to electrical sockets on a front portion of the main unit 12. A protective cover 16 is hingedly connected to the frame 14. In contrast to FIG. 3 however, a fixing plate 90 is used to secure the frame 14 to the main unit 12. The fixing plate 90 is sized to fit within the frame 14 and receive screws or other fasteners 92 that pass through the fixing plate 90 into the main unit 12. The fixing plate 90 has an outer diameter that is wider than portions of the inside sidewall of the base frame 14. Accordingly, when the fixing plate 90 is fitted within the frame 14 and screws 92 are driven through the fixing plate 90 into the front portion of the main unit 12, the fixing plate 90 secures the frame 14 to the main unit 12. When a panel door is sandwiched therebetween (e.g., as shown in FIG. 3), the frame 14 and the main unit 12 are fixed to the panel door.

As can be seen in the foregoing description, in various embodiments, the panel adapter 10 including the main unit 12 may be constructed to provide some or all of the following features:

(1) Measurement instrument voltage measuring connections are provided via standard 4 mm safety sockets;

(2) Measurement instrument current measuring connections are provided via 4 pin ODU sockets or BNC adapters;

(3) Internal cabinet voltage connections are wired to the main unit via standard screw terminals;

(4) Voltage connections are safety protected using inline fuses to protect against overcurrent conditions;

(5) Internal cabinet current test points are connected to standard current sensors via 4 pin ODU connectors or BNC adapters;

(6) Current connection sockets facilitate using standard off-the-shelf current sensors inside the cabinet;

(7) Installation orientation of the main unit can be rotated 360 degrees to allow for mounting the panel adapter in different areas of the cabinet, such as any of the four corners of the cabinet panel door, thus facilitating connection of the main unit to electrical wires or measurement instruments inside the cabinet;

(8) Simplified installation is achieved using a Kwik Stepper drill bit or electrohydraulic hole punch to define an aperture in the panel door for mounting the panel adapter; and (9) Cat III 1000V/Cat IV 600V safety rating is provided according to IEC 61010, with an IP67 rating when a protective cover is installed and placed in the closed position.

In view of the foregoing description, it is readily appreciated that various embodiments of the present disclosure may include an electrical panel adapter for an enclosure that is formed of at least one panel, wherein the electrical panel adapter comprises a main unit having a front portion and a rear portion. The rear portion includes a first plurality of electrical connections, which may be electrical terminals, adapted to connect to electrical wires and/or equipment located inside the enclosure. The front portion includes a second plurality of electrical connections, which may be electrical sockets, adapted to connect to one or more electrical devices located outside the enclosure for measurement of both voltage and current in the electrical wires and/or equipment. As described above, the second plurality of electrical connections are electrically coupled to the first plurality of electrical connections.

The electrical panel adapter is installable on the enclosure such that the rear portion of the main unit is positioned inside the enclosure and the front portion of the main unit extends through an aperture in the at least one panel. Accordingly, the second plurality of connections are accessible from outside the enclosure for connection to electrical devices located outside the enclosure. When the electrical panel adapter is installed, the panel adapter enables electrical devices outside the enclosure to be electrically coupled to the electrical wires and/or equipment inside the enclosure via the first and second electrical connections without requiring the enclosure to be opened.

In various embodiments, the electrical panel adapter may further comprise an overcurrent protection device coupled between at least one first electrical connection and at least one second electrical connection when the at least one first electrical connection is configured to receive an electrical signal for measurement of voltage inside the enclosure. Conversely, an overcurrent protection device is not necessarily coupled between a first electrical connection and a second electrical connection when the first electrical connection is configured to receive an electrical signal for measurement of current inside the enclosure.

In various embodiments, the electrical panel adapter may further comprise a base frame that is securable to the main unit. When the electrical panel adapter is installed on the enclosure, the base frame and the main unit are positioned on opposite sides of the at least one panel. The base frame is secured to the main unit via fasteners that extend through the at least one panel and couple to the main unit, thereby securing the electrical panel adapter to the at least one panel of the enclosure. The base frame may be annular and provide an access port sized to provide external access to the front portion of the main unit that extends through the aperture in the at least one panel.

In various embodiments, the base frame and the main unit may be sized and configured such that the fasteners extend through the aperture in the at least one panel of the enclosure. Furthermore, the base frame and the main unit may have edge portions that abut against the opposite sides of the at least one panel. The edge portions of the base frame and the main unit abut against the opposite sides of the at least one panel and form a seal around the aperture in the at least one panel to protect the interior of the enclosure from the environment outside the enclosure.

In various embodiments, the electrical panel adapter further comprises a protective cover coupled to the panel adapter, e.g., to the base frame of the panel adapter. The protective cover is positionable between a closed position and an open position. When the protective cover is in the closed position, the protective cover preferably seals against the base frame and protects the second plurality of electrical connections from the environment outside the enclosure. The protective cover may include a transparent surface such that, when the protective cover is positioned in the closed position, the second electrical connections of the main unit are visible through the transparent surface to the environment outside the enclosure.

In various embodiments, the electrical panel adapter may further comprise an annular fixing ring sized and configured to fit within the base frame and receive the fasteners that extend through the at least one panel. The fixing ring may have an outside diameter that is larger than an inside diameter of at least portions of the base frame. With such configuration, the fixing ring may abut against the base frame when the fasteners secure the base frame to the main unit.

Alternatively, in various embodiments, the electrical panel adapter may further comprise a fixing plate that is sized and configured to fit within the base frame and receive the fasteners that extend through the at least one panel. The fixing plate includes apertures that correspond to the second plurality of electrical connections and provide external access to the second plurality of electrical connections. The fixing plate may have having a diameter that is larger than an inside diameter of at least portions of the base frame. As with the fixing ring, with such a configuration, the fixing plate may abut against the base frame when the fasteners secure the base frame to the main unit.

In various embodiments, the main unit is rotatable relative to the at least one panel. Thus, the main unit may be rotated to a mounting position having a desired orientation that facilitates connection of the second plurality of electrical connections to electrical wires and/or equipment located inside the enclosure.

As mentioned earlier, the first plurality of electrical connections may be terminals on the rear portion of the main unit. In such embodiments, the terminals are connectable via cabling to test points on the electrical wires and/or equipment located inside the enclosure for measurement of electrical parameters of the electrical wires and/or equipment.

In various embodiments, the electrical panel adapter may further comprise a notched structure that extends from a surface of the main unit. The notched structure may extend from a surface adjacent to the first plurality of electrical connections. Preferably, the notched structure is configured to provide strain relief to the cabling that connects the first plurality of electrical connections to the electrical wires and/or equipment.

Also as mentioned earlier, the second plurality of electrical connections may be sockets on the front portion of the main unit. In such embodiments, the sockets are connectable via cabling to one or more electrical devices located outside the enclosure for communicating electrical signals between the first plurality of electrical connections and the electrical device(s) outside the enclosure. At least one of the second plurality of electrical connections is configured to communicate an electrical signal for measurement of voltage inside the enclosure and at least another one of the second plurality of electrical connections is configured to communicate an electrical signal for measurement of current inside the enclosure.

In various embodiments, the electrical panel adapter may further comprise an output socket that supplies electrical power to devices outside the enclosure. In such embodiments, circuitry within the main unit may include one or more electrical lines that are connected to the output socket to supply electrical power to the output socket. Preferably, the circuitry draws the electrical power from an electrical wire or equipment inside the enclosure that is connected to at least one of the first electrical connections.

In view of the above description, it is also readily appreciated that various embodiments of the present disclosure include methods of installing an electrical panel adapter on an enclosure formed of at least one panel. In various embodiments, the method(s) may include defining an aperture in the at least one panel of the enclosure, and fitting a main unit of the electrical panel adapter into the defined aperture, wherein the main unit has a front portion and a rear portion, the rear portion including a first plurality of electrical connections adapted to connect to electrical wires and/or equipment located inside the enclosure, and the front portion including a second plurality of electrical connections adapted to connect to one or more electrical devices located outside the enclosure, the second plurality of electrical connections being electrically coupled to the first plurality of electrical connections.

Installation of the electrical panel adapter includes positioning the rear portion of the main unit inside the enclosure and the front portion of the main unit within the aperture defined in the at least one panel of the enclosure, such that the front portion of the main unit extends through the aperture. Accordingly, the second plurality of connections on the front portion of the main unit are accessible from outside the enclosure for connection to electrical devices outside the enclosure. In this manner, the electrical panel adapter enables electrical devices outside the enclosure to be electrically coupled to the electrical wires and/or equipment inside the enclosure via the first and second electrical connections without requiring the enclosure to be opened.

In various embodiments, a method of installing the electrical panel adapter may be employed with an electrical panel adapter that further has a base frame which is securable to the main unit. In such embodiments, the method may further comprise positioning the base frame and the main unit on opposite sides of the at least one panel of the enclosure, and securing the base frame to the main unit via fasteners that extend through the at least one panel, thereby securing the electrical panel adapter to the at least one panel of the enclosure.

In various embodiments, a method of installing an electrical panel adapter may be employed with an electrical panel adapter that further has a protective cover coupled to the base frame, wherein the protective cover is positionable between a closed position and an open position. In such embodiments, the method further comprises positioning the protective cover in the closed position, and sealing the protective cover against the base frame to protect the second plurality of electrical connections from the environment outside the enclosure.

In various embodiments, a method of installing an electrical panel adapter may be employed with an electrical panel adapter that further has an annular fixing ring that is sized and configured to fit within the base frame. The fixing ring has an outside diameter that is larger than an inside diameter of at least portions of the base frame and receives the fasteners that extend through the at least one panel of the enclosure. In such embodiments, the method further comprises inserting the fixing ring into the base frame such that the fixing ring abuts against the base frame, and securing the base frame to the main unit by extending the fasteners through the fixing ring and the at least one panel and coupling the fasteners to the main unit.

Alternatively, in various embodiments, a method of installing an electrical panel adapter may be employed with an electrical panel adapter that has a fixing plate sized and configured to fit within the base frame. The fixing plate has a diameter that is larger than an inside diameter of at least portions of the base frame and receives the fasteners that extend through the at least one panel. In such embodiments, the method further comprises inserting the fixing plate into the base frame such that the fixing plate abuts against the base frame, aligning apertures in the fixing plate with the second plurality of electrical connections on the front portion of the main unit, and securing the base frame to the main unit by extending the fasteners through the fixing plate and the at least one panel and coupling the fasteners to the main unit.

It should be appreciated that the various embodiments described above can be combined to provide yet further embodiments of the electrical panel adapter 10 and methods of installing the same. Aspects of the embodiments can be modified, and other changes can be made to the embodiments in light of the above-detailed description, without departing from the spirit or scope of the disclosure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electrical panel adapter for an enclosure that is formed of at least one panel, the electrical panel adapter comprising:
   a main unit having a front portion and a rear portion, wherein the rear portion includes a first plurality of electrical connections adapted to connect to electrical wires and/or equipment located inside the enclosure, and the front portion includes a second plurality of electrical connections adapted to connect to one or more electrical devices located outside the enclosure for electrical measurement inside the enclosure, the second plurality of electrical connections being electrically coupled to the first plurality of electrical connections;
   wherein the electrical panel adapter is installable on the enclosure such that the rear portion of the main unit is positioned inside the enclosure and the front portion of the main unit extends through an aperture in the at least one panel so that the second plurality of electrical connections are accessible from outside the enclosure for connection to electrical devices located outside the enclosure, and when installed, the electrical panel adapter enables electrical devices outside the enclosure to be electrically coupled to the electrical wires and/or equipment inside the enclosure via the first and second plurality of electrical connections without requiring the enclosure to be opened;
   the electrical panel adapter further comprising a base frame that is securable to the main unit, wherein when the electrical panel adapter is installed on the enclosure, the base frame and the main unit are positioned on opposite sides of the at least one panel, with at least a portion of the at least one panel sandwiched between the base frame and the main unit.

2. The electrical panel adapter of claim 1, wherein the base frame is secured to the main unit via fasteners that extend through the at least one panel and couple to the main unit, thereby securing the electrical panel adapter to the at least one panel of the enclosure.

3. The electrical panel adapter of claim 2, wherein the base frame and the main unit are sized and configured such that the fasteners extend through the aperture in the at least one panel, and the base frame and the main unit have edge portions that abut against the opposite sides of the at least one panel.

4. The electrical panel adapter of claim 3, wherein the edge portions of the base frame and the main unit that abut against the opposite sides of the at least one panel form a seal around the aperture in the at least one panel to protect the interior of the enclosure from an environment outside the enclosure.

5. The electrical panel adapter of claim 1, further comprising a protective cover coupled to the base frame, wherein the protective cover is positionable between a closed position and an open position, and when the protective cover is in the closed position, the protective cover seals against the base frame and protects the second plurality of electrical connections from an environment outside the enclosure.

6. The electrical panel adapter of claim 5, wherein the protective cover includes a transparent surface such that, when the protective cover is positioned in the closed position, the second plurality of electrical connections are visible through the transparent surface to the environment outside the enclosure.

7. The electrical panel adapter of claim 2, wherein the base frame is annular and provides an access port sized to provide external access to the front portion of the main unit that extends through the aperture in the at least one panel.

8. The electrical panel adapter of claim 7, further comprising an annular fixing ring sized and configured to fit within the base frame and receive the fasteners that extend through the at least one panel, wherein the annular fixing ring has an outside diameter that is larger than an inside diameter of at least portions of the base frame, the annular fixing ring abutting against the base frame when the fasteners secure the base frame to the main unit.

9. The electrical panel adapter of claim 7, further comprising a fixing plate sized and configured to fit within the base frame and receive the fasteners that extend through the at least one panel, wherein the fixing plate includes apertures that correspond to the second plurality of electrical connections and provide external access to the second plurality of electrical connections, the fixing plate further having a diameter that is larger than an inside diameter of at least portions of the base frame, and the fixing plate abutting against the base frame when the fasteners secure the base frame to the main unit.

10. The electrical panel adapter of claim 1, wherein the main unit is rotatable relative to the at least one panel to a mounting position having a desired orientation that facilitates connection of the first plurality of electrical connections to the electrical wires and/or equipment located inside the enclosure.

11. The electrical panel adapter of claim 1, wherein the first plurality of electrical connections are terminals that are connectable via cabling to test points inside the enclosure for measurement of electrical parameters including both voltage and current inside the enclosure.

12. The electrical panel adapter of claim 11, further comprising a notched structure that extends from a surface of the main unit adjacent to the first plurality of electrical connections, wherein the notched structure is configured to provide strain relief to the cabling that connects the first plurality of electrical connections to the electrical wires and/or equipment.

13. The electrical panel adapter of claim 1, wherein the second plurality of electrical connections are sockets that are connectable via cabling to one or more electrical devices located outside the enclosure for communicating electrical signals between the first plurality of electrical connections and the one or more electrical devices outside the enclosure, wherein at least one of the second plurality of electrical connections is configured to communicate an electrical signal for measurement of voltage inside the enclosure and at least another one of the second plurality of electrical connections is configured to communicate an electrical signal for measurement of current inside the enclosure.

14. The electrical panel adapter of claim 1, further comprising an overcurrent protection device coupled between at least one first electrical connection and at least one second electrical connection when the at least one first electrical connection is configured to receive an electrical signal for measurement of voltage inside the enclosure, while an overcurrent protection device is not coupled between a first electrical connection and a second electrical connection when said first electrical connection is configured to receive an electrical signal for measurement of current inside the enclosure.

15. The electrical panel adapter of claim 1, further comprising an output socket and circuitry within the main unit that includes one or more electrical lines connected to the output socket to supply electrical power to the output socket, wherein the electrical power is drawn from an electrical wire or equipment inside the enclosure that is connected to at least one of the first plurality of electrical connections.

16. A method of installing an electrical panel adapter on an enclosure formed of at least one panel, the method comprising:
    fitting a main unit of the electrical panel adapter into an aperture in the at least one panel of the enclosure, wherein the main unit has a front portion and a rear portion, the rear portion including a first plurality of electrical connections adapted to connect to electrical wires and/or equipment located inside the enclosure, and the front portion including a second plurality of electrical connections adapted to connect to one or more electrical devices located outside the enclosure, the second plurality of electrical connections being electrically coupled to the first plurality of electrical connections,
    positioning the rear portion of the main unit inside the enclosure, and
    positioning the front portion of the main unit in the aperture such that the front portion of the main unit extends through the aperture so that the second plurality of connections are accessible from outside the enclosure for connection to electrical devices outside the enclosure, whereby the electrical panel adapter enables electrical devices outside the enclosure to be electrically coupled to the electrical wires and/or equipment inside the enclosure via the first and second plurality of electrical connections without requiring the enclosure to be opened,
    wherein the electrical panel adapter further has a base frame that is securable to the main unit, the method further comprising:
    positioning the base frame and the main unit on opposite sides of the at least one panel of the enclosure, and
    securing the base frame to the main unit such that at least a portion of the at least one panel is sandwiched between the base frame and the main unit.

17. The method of installing an electrical panel adapter according to claim 16, wherein the base frame is secured to the main unit via fasteners that extend through the at least one panel, thereby securing the electrical panel adapter to the at least one panel of the enclosure.

18. The method of installing an electrical panel adapter according to claim 16, wherein the electrical panel adapter further has a protective cover coupled to the base frame, and the protective cover is positionable between a closed position and an open position, the method further comprising:
    positioning the protective cover in the closed position; and
    sealing the protective cover against the base frame to protect the second plurality of electrical connections from an environment outside the enclosure.

19. The method of installing an electrical panel adapter according to claim 16, wherein the electrical panel adapter further has an annular fixing ring sized and configured to fit within the base frame and receive fasteners that extend through the at least one panel, the fixing ring having an outside diameter that is larger than an inside diameter of at least portions of the base frame, the method further comprising:
    inserting the fixing ring into the base frame such that the fixing ring abuts against the base frame; and
    securing the base frame to the main unit by extending the fasteners through the fixing ring and the at least one panel and coupling the fasteners to the main unit.

20. The method of installing an electrical panel adapter according to claim 16, wherein the electrical panel adapter further has a fixing plate sized and configured to fit within the base frame and receive fasteners that extend through the at least one panel, the annular fixing plate having a diameter that is larger than an inside diameter of at least portions of the base frame, the method further comprising:
    inserting the annular fixing plate into the base frame such that the annular fixing plate abuts against the base frame;
    aligning apertures in the fixing plate with the second plurality of electrical connections on the front portion of the main unit; and
    securing the base frame to the main unit by extending the fasteners through the annular fixing plate and the at least one panel and coupling the fasteners to the main unit.

* * * * *

UNITED STATES PATENT AND TRADEMARK OFFICE
CERTIFICATE OF CORRECTION

PATENT NO. : 11,552,460 B2
APPLICATION NO. : 16/443572
DATED : January 10, 2023
INVENTOR(S) : Ferdinand Y. Laurino et al.

Page 1 of 1

It is certified that error appears in the above-identified patent and that said Letters Patent is hereby corrected as shown below:

In the Claims

Column 16, Claim 19, Line 21:
"the fixing ring" should read: --the annular fixing ring--.

Column 16, Claim 19, Line 25:
"the fixing ring" should read: --the annular fixing ring--.

Column 16, Claim 19, Lines 25-26:
"the fixing ring" should read: --the annular fixing ring--.

Column 16, Claim 19, Line 28:
"the fixing ring" should read: --the annular fixing ring--.

Column 16, Claim 20, Line 34:
"the annular fixing plate" should read: --the fixing plate--.

Column 16, Claim 20, Line 37:
"the annular fixing plate" should read: --the fixing plate--.

Column 16, Claim 20, Line 38:
"the annular fixing plate" should read: --the fixing plate--.

Column 16, Claim 20, Line 44:
"the annular fixing plate" should read: --the fixing plate--.

Signed and Sealed this
Eleventh Day of March, 2025

Coke Morgan Stewart
*Acting Director of the United States Patent and Trademark Office*